(12) United States Patent
Zheng et al.

(10) Patent No.: US 6,613,457 B2
(45) Date of Patent: Sep. 2, 2003

(54) ELECTROLUMINESCENT DEVICES HAVING DIARYLANTHRACENE LADDER POLYMERS IN EMISSIVE LAYERS

(75) Inventors: Shiying Zheng, Webster, NY (US); Jianmin Shi, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/941,009

(22) Filed: Aug. 28, 2001

(65) Prior Publication Data

US 2003/0082401 A1 May 1, 2003

(51) Int. Cl.[7] ............................................. H05B 33/14
(52) U.S. Cl. ........................ 428/690; 428/917; 313/503; 313/504
(58) Field of Search ................................ 428/690, 917; 313/503, 504

(56) References Cited

U.S. PATENT DOCUMENTS

| | | |
|---|---|---|
| 4,356,429 A | 10/1982 | Tang |
| 4,769,292 A | 9/1988 | Tang et al. |
| 5,429,884 A | 7/1995 | Namiki et al. |
| 5,776,622 A | 7/1998 | Hung et al. |
| 5,777,070 A | 7/1998 | Inbasekaran et al. |
| 5,935,721 A | 8/1999 | Shi et al. |
| 5,972,247 A | 10/1999 | Shi et al. |

OTHER PUBLICATIONS

Burroughes et al, Light–emitting diodes based on conjugated polymers, Nature, vol. 347, 1990, pp. 539–541.

Ohmori et al, Blue Electroluminescent Diodes Utilizing Poly(alkylfluorene), Jap. Jour. of Applied Physics, vol. 30, No. 11B, 1991, pp. L1941–1943.

Grem et al, Realization of a Blue–Light–Emitting Device using Poly(p–phenylene), Advanced Materials, 4 (1992), No. 1, pp. 36–37.

Groenendaal et al, Poly(3,4–ethylenedioxythiophene) and Its Derivatives: Past, Present, and Future, Advanced Materials 2000, 12, No. 7, pp. 481–494.

Ohmori et al, Effects of Alkyl Chain Length and Carrier Confinement Layer on Characteristics of Poly(3–Alkylthiophene) Electroluminescent Diodes, Solid State Comm. vol. 80, No. 8, 1991, pp. 605–608.

Huber et al, Blue light–emitting diodes based on ladder polymer of the PPP type, Acta. Polymer, 45, pp. 244–247, 1994.

Scherf et al, A soluble ladder polymer via bridging of functionalized poly(p–phenylene)–precursors, Makromol. Chem, Rapid Commun. 12, 1991, pp. 489–497.

Primary Examiner—Cynthia H. Kelly
Assistant Examiner—Dawn Garrett
(74) Attorney, Agent, or Firm—Raymond L. Owens

(57) ABSTRACT

An organic light emitting diode having an anode, a cathode and an emissive layer disposed between the anode and cathode, the emissive layer including the following repeating unit which is used to form a homopolymer or a copolymer comprising the structure:

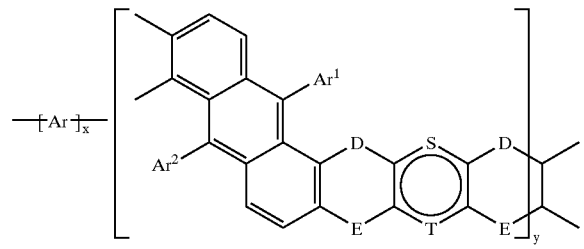

wherein the terms are defined in the specification.

13 Claims, 5 Drawing Sheets

| 4000 |
|---|
| 3000 |
| 2000 |
| 1000 |

FIG 3

ELECTROLUMINESCENT DEVICES HAVING DIARYLANTHRACENE LADDER POLYMERS IN EMISSIVE LAYERS

CROSS REFERENCE TO RELATED APPLICATION

Reference is made to commonly-assigned U.S. Ser. No. 09/941,1205 filed herewith, pending, entitled "Electroluminescent Devices Having Diarylanthracene Polymers" by Zheng et al the disclosure of which is incorporated herein.

FIELD OF THE INVENTION

The present invention relates to electroluminescent (EL) devices having diarylanthracene ladder polymers.

BACKGROUND OF THE INVENTION

Electroluminescent (EL) devices such as light emitting diode (LED) are opto-electronic devices which radiate light on the application of an electrical field. Organic materials including both polymers and small molecules have been used to fabricate LEDs. LEDs fabricated from these materials offer several advantages over other technologies, such as simpler manufacturing, low operating voltages, and the possibility of producing large area and full-color displays. Organic polymers generally offer significant processing advantages over small molecules especially for large area EL display because polymer films can be easily produced by casting from solutions.

Conjugated polymers are a class of polymers that possess an extended π-bond network along polymer main chain. Their electronic states can delocalize caused by the effect of the electron-lattice and electron-electron interactions. Conjugated polymers such as poly(p-phenylvinylene) (PPV) were first introduced as EL materials by Burroughes et al in 1990 (Burroughes, J. H. Nature 1990, 347, 539–41). EL efficiency has been improved by balanced electron-hole injection, charge transport, and recombination of the charge carriers. Other conjugated polymers such as polydialkylfluorene (PF) (Ohmori, Y. et al Jpn. J. Appl. Phys. Part 2 1991, 20, L1941), poly(p-phenylene) (PPP) (Grem, G. et al Adv. Mater. 1992, 4, 36), and poly(thiophene) (Ohmori, Y. et al Solid State Commun. 1991, 80, 605) have also been studied.

The light-emitting layer of an EL device comprises a highly luminescent material where electroluminescence is produced as a result of electron-hole pair recombination in this region. In order to achieve efficient light output, efficient and highly fluorescent materials are required. 9,10-Diaryl substituted anthracenes are well known for their high fluorescence efficiency. The highly efficient light output and high operational stability of EL devices have been disclosed in commonly assigned U.S. Pat. Nos. 5,935,721 and 5,972,247 by using substituted diarylanthracenes as light-emitting materials. Ladder polymers containing diarylanthracene moiety are interesting new EL materials. Ladder type π-conjugated polymers possess outstanding optoelectronic properties, thermal and chemical stability, low concentration of defects, and high intrachain order due to their planar structure (Huber et al. Acta Polymer, 1994, 45, 244)

SUMMARY OF THE INVENTION

It is an object of the present invention to provide new luminescent polymeric materials useful for polymer EL devices.

It is a further object of the present invention to provide various energy band gap luminescent polymers which emit broad range of color.

A new class of diarylanthracene-based ladder polymers has been discovered for use in electroluminescent devices.

These objects are achieved in an organic light emitting diode having an anode, a cathode and an emissive layer disposed between the anode and cathode, the emissive layer including the following repeating unit which is used to form a homopolymer or a copolymer comprising the structure:

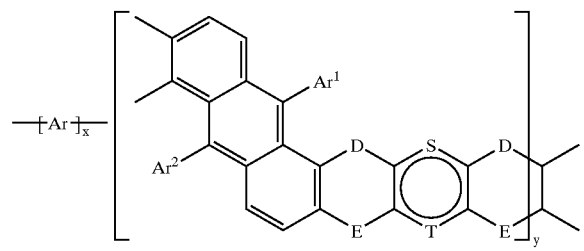

wherein:

$0 \leq x < 1$, $0 < y \leq 1$, and $x+y=1$;

S and T are each independently a chemical bond, an oxygen or sulfur atom, or C—R, or N—R wherein C is a carbon atom, N is a nitrogen atom, and R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

In each ring, including D and E, if either D or E is a single bond, then the other group is not a single bond and is R—C—R, wherein C is a carbon atom and R is a substituent as defined above;

$Ar^1$, $Ar^2$, and Ar are each individually aryl or substituted aryl of from 6 to 40 carbon atoms; or $Ar^1$, $Ar^2$, and Ar are each individually substituted heteroaryl or unsubstituted heteroaryl having 4 to 40 carbons.

The present invention provides light-emitting materials with a number of advantages that include good solubility, efficiency, and stability, low concentration of defects, and high intrachain order. The emitting color of the polymer can be easily tuned by the incorporation of desired Ar group. Furthermore, other electro-optical properties can also be tuned with Ar group. The materials from the present invention can also be used as host materials for other light emitting materials, or as dopants for other suitable light emitting materials.

BRIEF DESCRIPTION OF THE DRAWINGS

FIG. 3 illustrates a cross-section of a single-layer EL device which can use a polymer in accordance with the present invention;

DETAILED DESCRIPTION OF THE INVENTION

Figure 1:
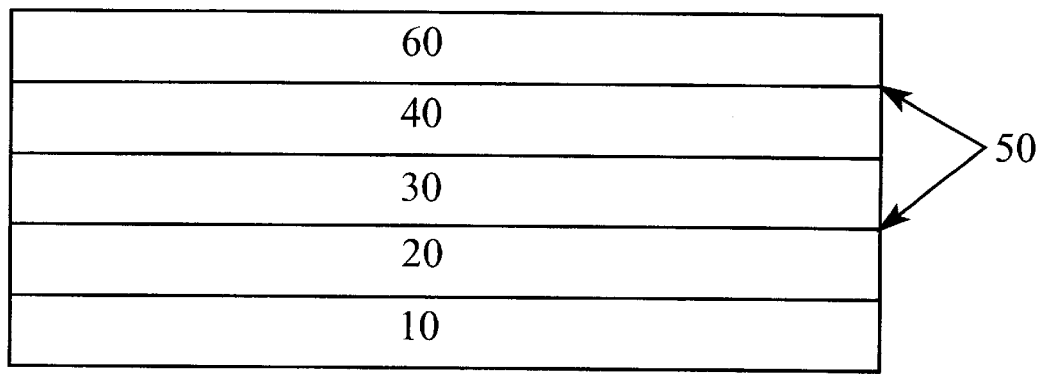
FIG. 1 illustrates in cross-section a bi-layer EL device which can use a polymer in accordance with the present invention.

The present invention provides light emitting polymers containing diarylanthracene ladder moiety with good solubility and thermal stability as shown in formula I. The rigid chromophore in the polymer main chain increases the rigidity of the polymer backbone and improves thermal properties. Polymers containing such chromophore are highly fluorescent and efficient light emitting materials. Incorporation of the Ar group has the following features:

1) to further improve solubility of the polymer;
2) to achieve balanced electron-hole injection and recombination of the charge carriers;
3) to improve electron or hole transporting ability; and
4) to tune the emissive color of the polymer.

The polymer shown in formula I is a homopolymer or a copolymer containing a diarylanthracene ladder unit.

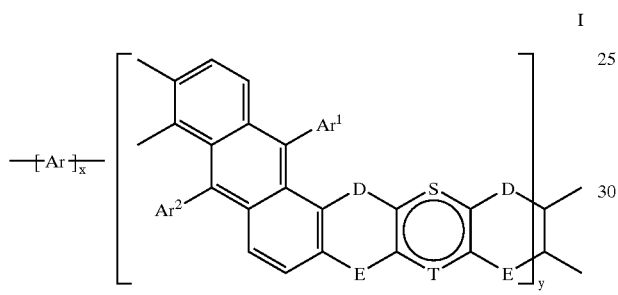

I wherein:
  $0 \leq x < 1$, $0 < y \leq 1$, and $x+y=1$;
  S and T are each independently a chemical bond, an oxygen or sulfur atom, or C—R, or N—R wherein C is a carbon atom, N is a nitrogen atom, and R is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;
  In each ring, including D and E, if either D or E is a single bond, then the other group is not a single bond and is R—C—R, wherein C is a carbon atom and R is a substituent as defined above;
  Ar$^1$, Ar$^2$, and Ar are each individually aryl or substituted aryl of from 6 to 40 carbon atoms; or
  Ar$^1$, Ar$^2$, and Ar are each individually substituted heteroaryl or unsubstituted heteroaryl having 4 to 40 carbons.

For example, Ar$^1$ and Ar$^2$ individually represent

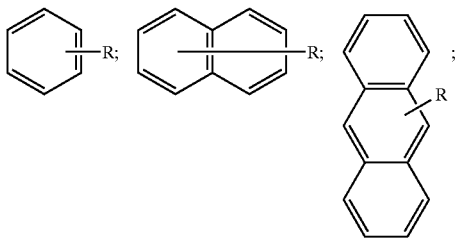

-continued

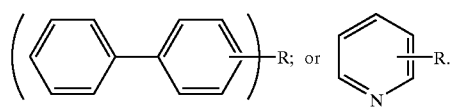

wherein: R is a substituent as defined above.

Ar represents the following groups:

Group 1:

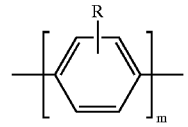

wherein: R is a substituent as defined above; and m is an integer from 1 to 3.

Group 2:

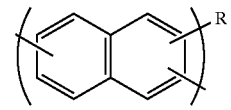

Group 3:

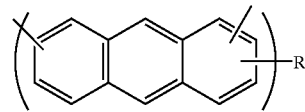

Group 4:

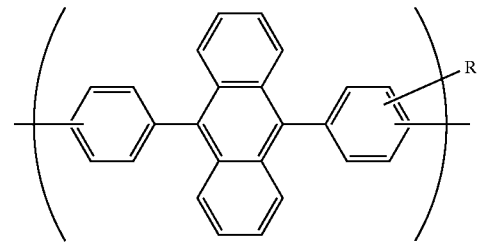

Group 5:

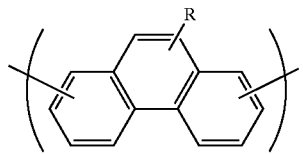

Group 6:

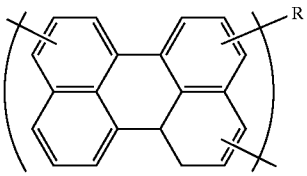

Group 7:

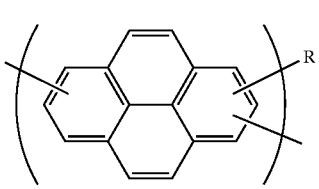

Group 8:

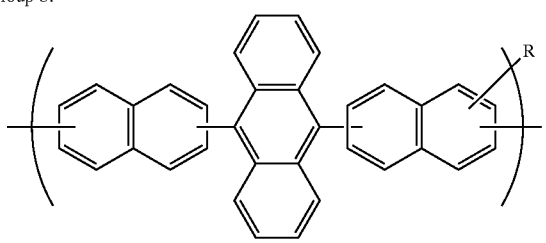

Group 9:

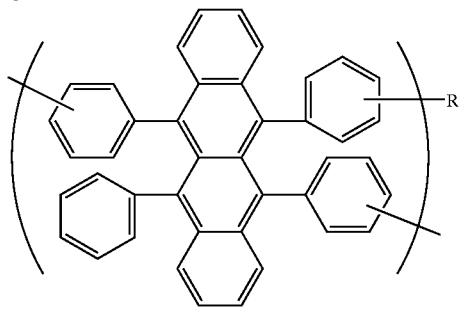

Group 10:

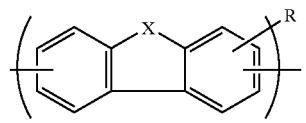

wherein: X is an O or S atom;

Group 11:

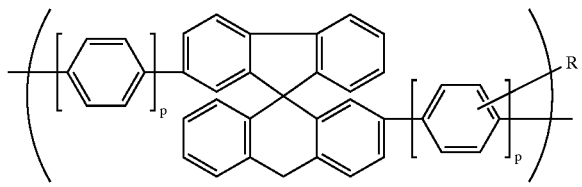

wherein: p is an integer from 0 to 2;

Group 12:

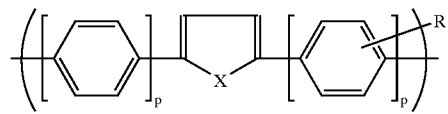

Group 13:

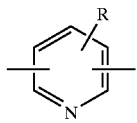

Group 14:

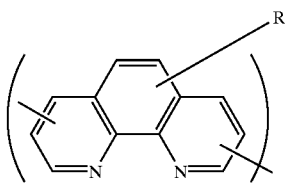

Group 15:

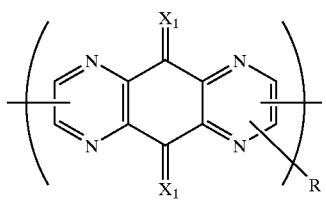

wherein: $X_1$ is an O atom or two cyano groups;

Group 16:

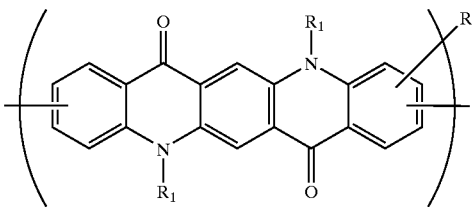

wherein: $R_1$ is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons;

Group 17:

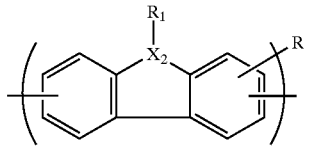

wherein: $X_2$ is a nitrogen or carbon atom;

Group 18:

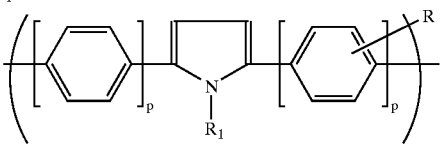

Group 19:

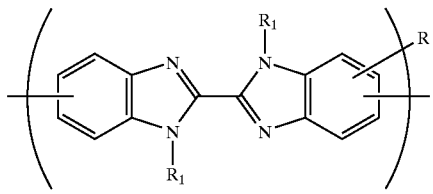

Group 20:

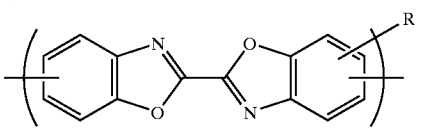

Group 21:

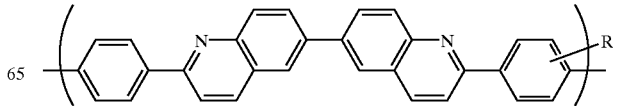

-continued

Group 22:

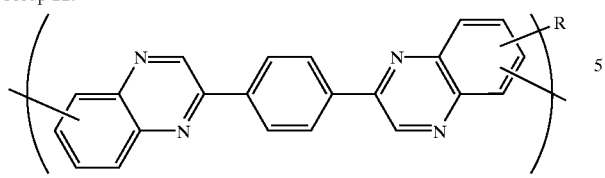

Group 23:

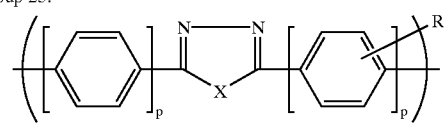

Group 24:

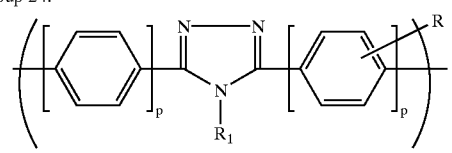

Group 25:

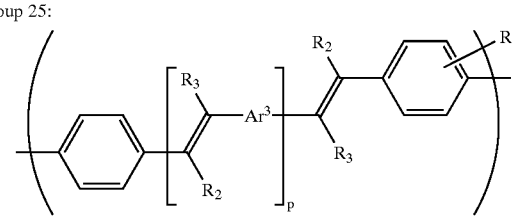

wherein: $Ar^3$ is defined as Ar; $R_2$ and $R_3$ are each independently hydrogen, alkyl group of from 1 to 24 carbon atoms, or aryl or substituted aryl of from 6 to 28 atoms, or heteroaryl or substituted heteroaryl of from 4 to 40 atoms, or a cyano group. Preferably, $R_2$ and $R_3$ are hydrogen, or a cyano group.

The following molecular structures constitute specific examples of preferred Ar unit satisfying the requirement of this invention:

Ar-1

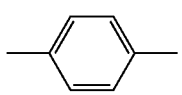

Ar-2

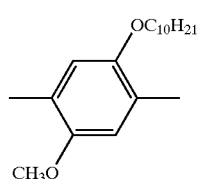

Ar-3

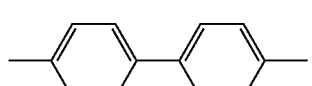

Ar-4

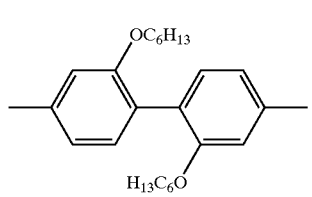

-continued

Ar-5

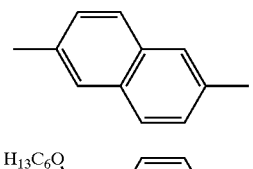

Ar-6

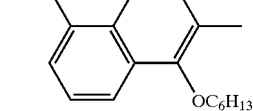

Ar-7

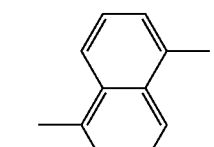

Ar-8

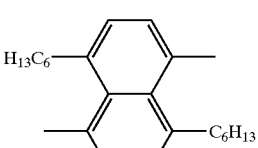

Ar-9

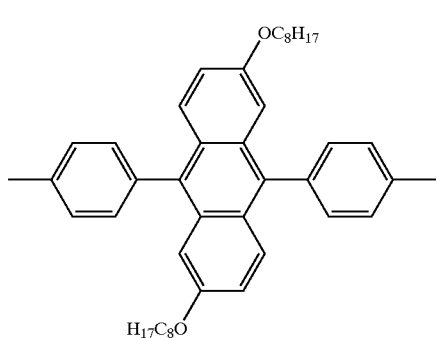

Ar-10

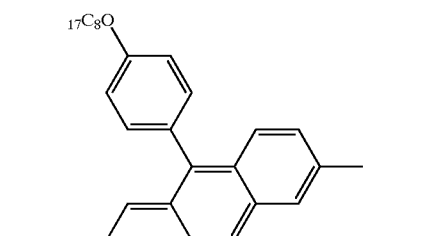

Ar-11

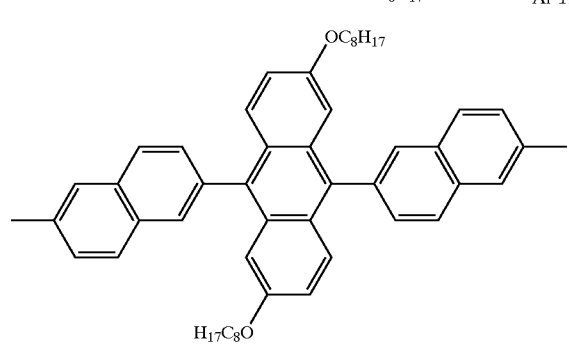

-continued
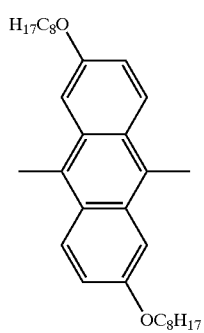
Ar-12
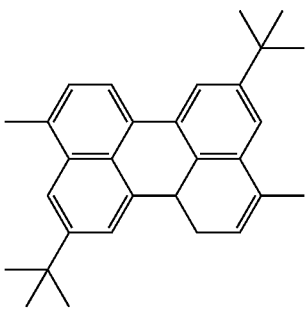
Ar-19
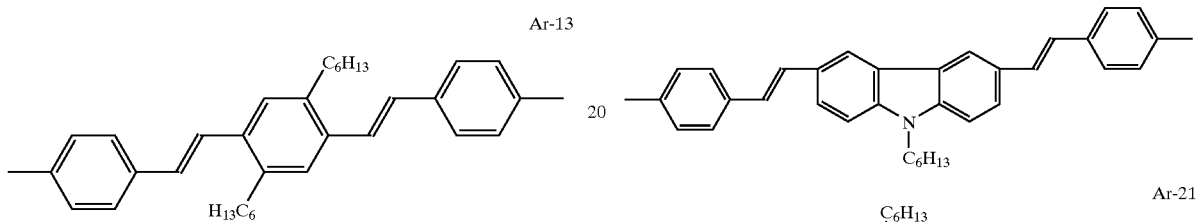
Ar-13
Ar-20
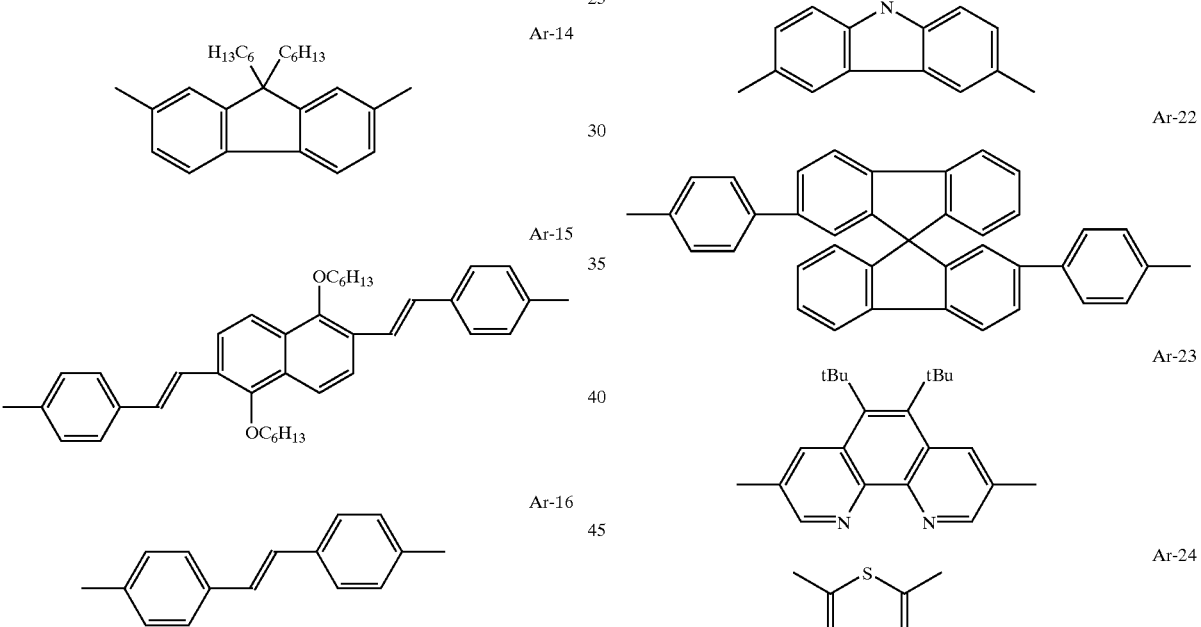
Ar-14
Ar-21
Ar-15
Ar-22
Ar-16
Ar-23
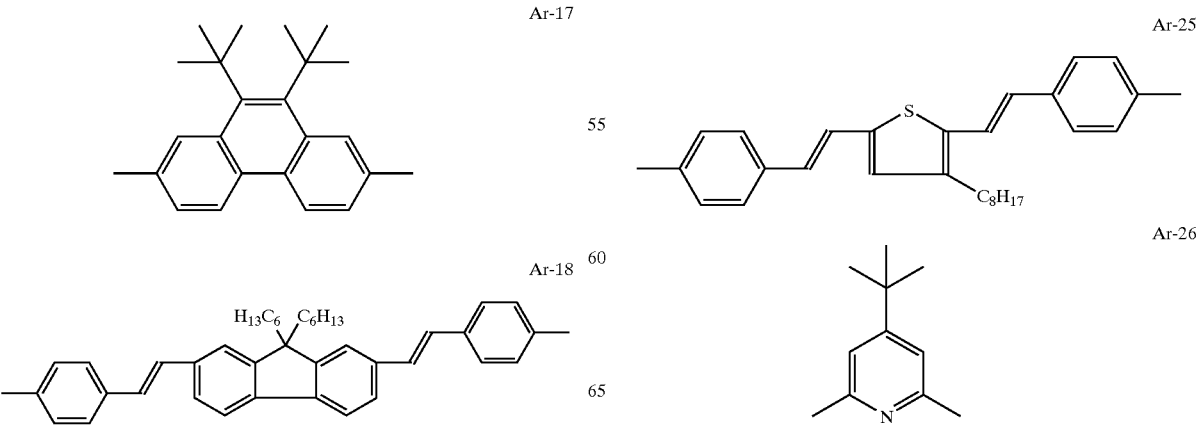
Ar-17
Ar-24
Ar-25
Ar-18
Ar-26

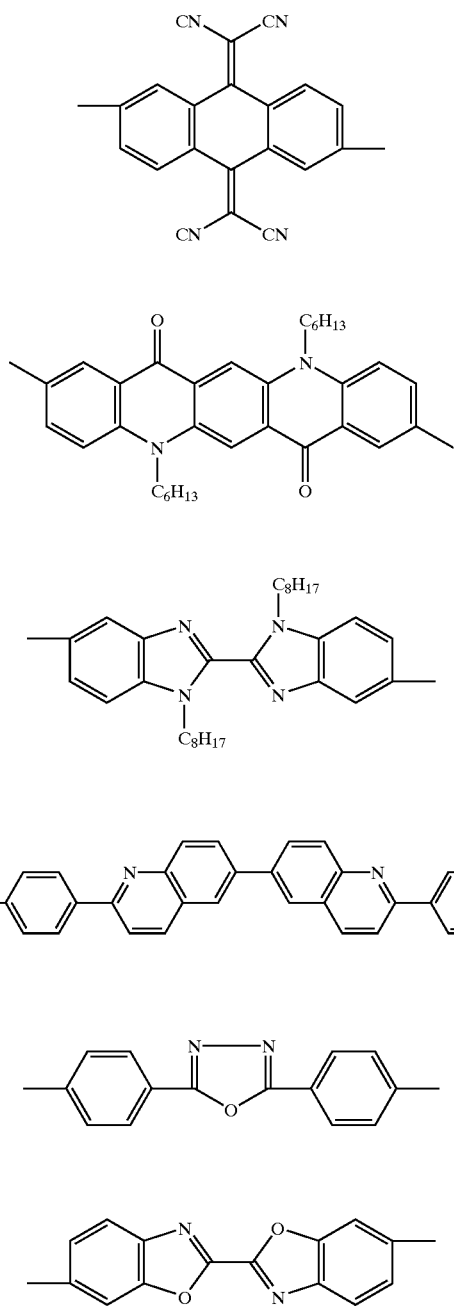

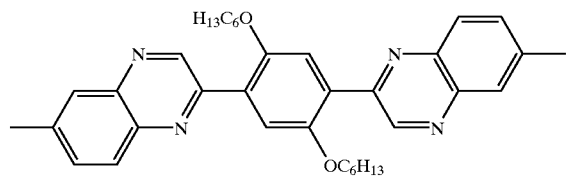
Ar-27

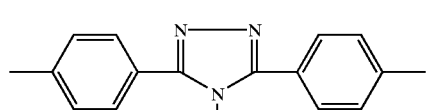
Ar-28

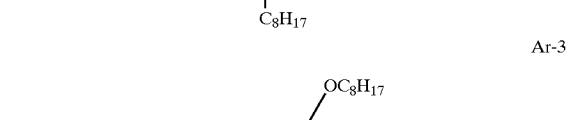
Ar-29

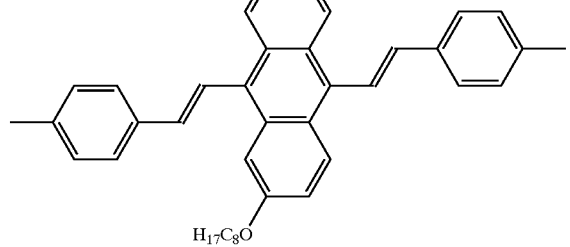
Ar-30

Ar-33

Ar-34

Ar-35

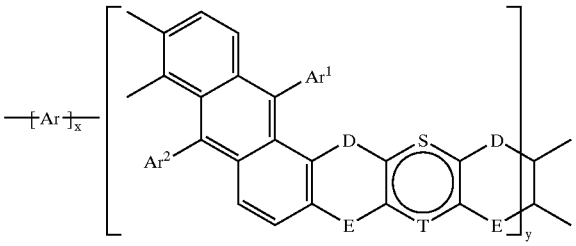

In formula I:

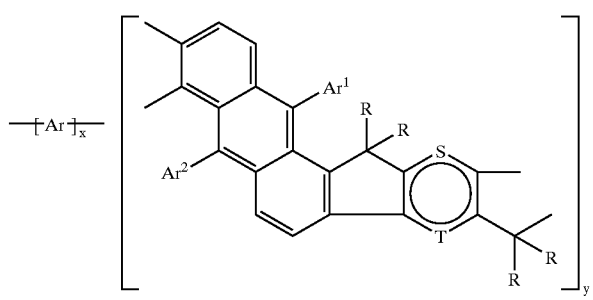

Ar includes one or the combination of more than one of the above divided groups. The specific molecular structures include the combination of any of the above drawn structures.

In a preferred embodiment, in each ring including D and E in the above formula I, if either D or E is a single bond, then the other group is not a single bond and is R—C—R, wherein C is a carbon atom and R is a substituent as defined above.

The preferred polymers according to the present invention are represented by the following formulae II, III, and IV:

II

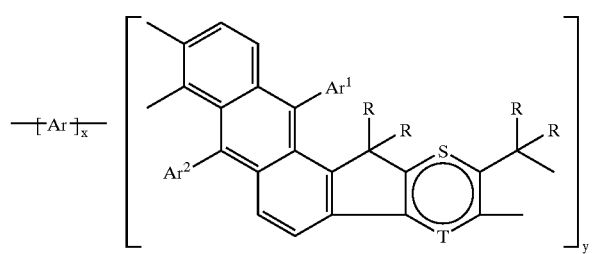
III
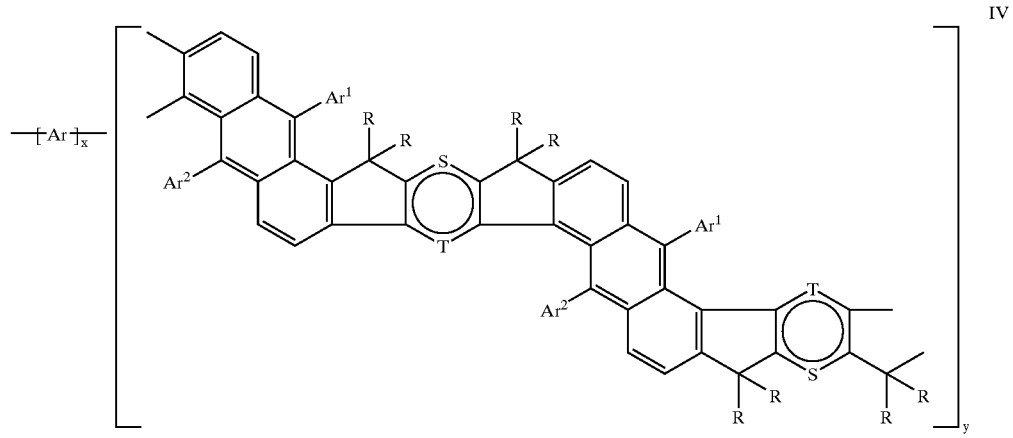
IV
In a more preferred embodiment, the S and T in the above formula I are C—R; one of D and E group in each ring is a chemical bond, while the other is CH—R. The preferred polymers according to the present invention are represented by the following formulae V—X:
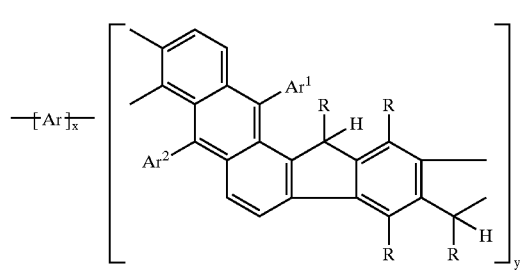
V
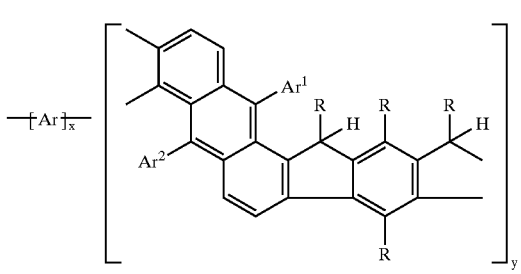
VI
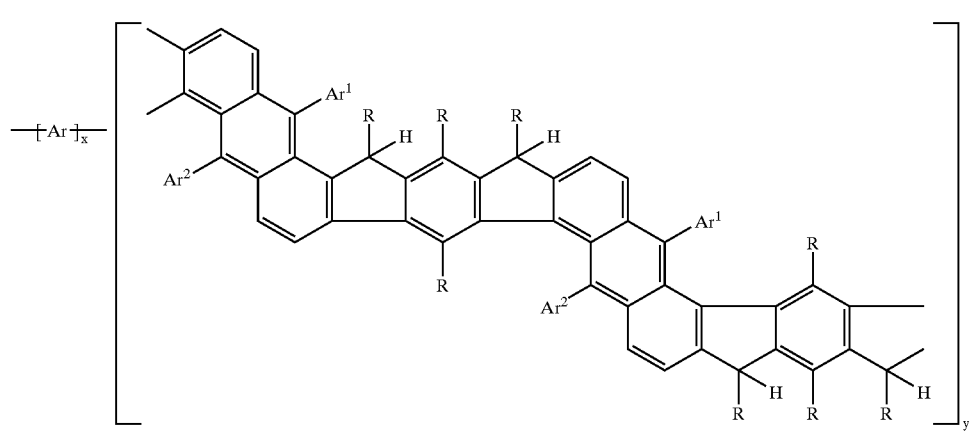
VII

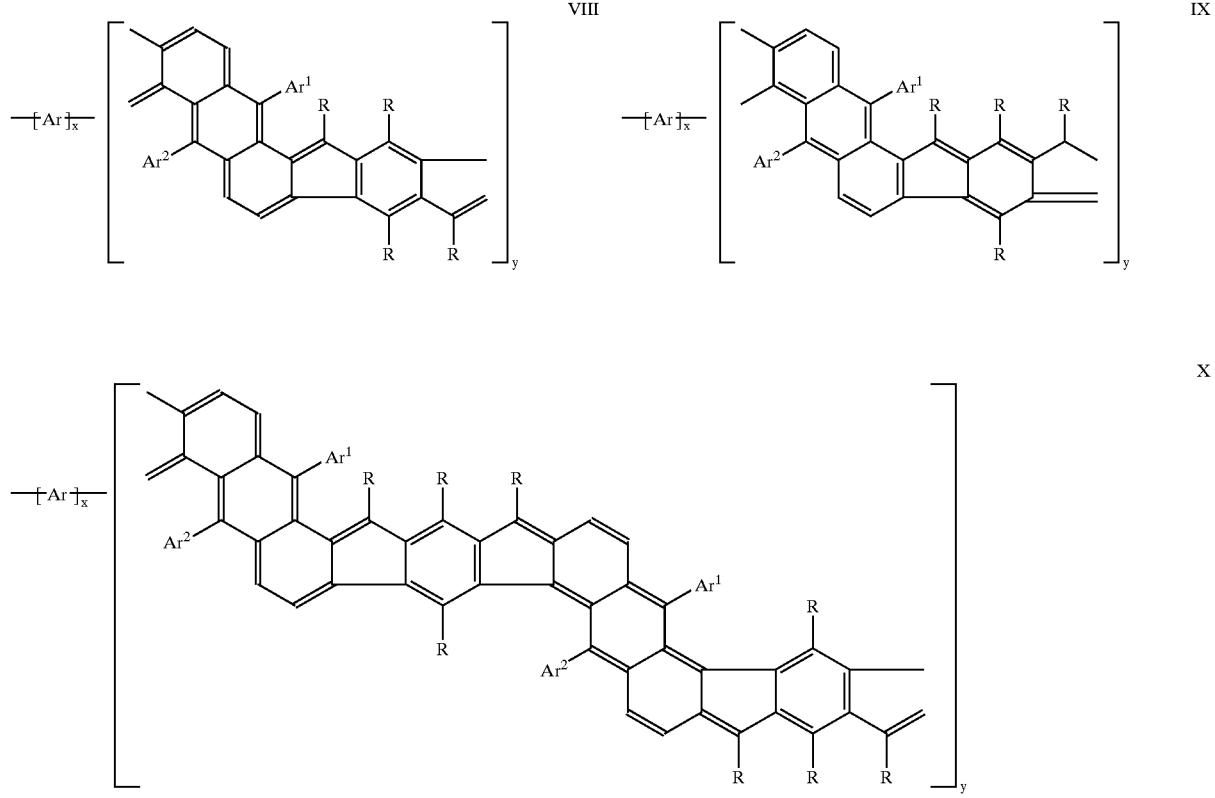

The polymers according to the present invention may contain dopes. Addition of the dopes allows for the increase of conductivity. Examples of the dopes include alkali metals, such as sodium or potassium; protonic acids, such as sulfuric acid, nitric acid, perchloric acid, chromic acid and hydriodic acid; Lewis acids, such as antimony (V) chloride, titanium (IV) chloride, ferric chloride, zinc chloride, tin (IV) chloride, arsenic (V) chloride, and arsenic (V) fluoride; and halogen, such as iodine. The doping process is generally carried out by allowing the vapor or the solution of the dope(s) to act on the polymer. The doped polymers preferably contain 0.01 to 30% by weight of dope, more preferably from 0.1 to 20% by weight.

The polymers according to the present invention can include one of the above mentioned polymers or the blend of two or more polymers, or polymers doped with one or more fluorescent dyes (FD), phosphorescent materials, or other light-emitting materials. The dopant is usually present in an amount on the order of a few molar percent or less of the host polymer and it is sufficient to cause the EL emission to be predominantly that of the fluorescent dye. Using this method, highly efficient EL devices can be constructed. Simultaneously, the color of the EL devices can be tuned using dopants such as FD of different emission wavelengths. By using a mixture of FD, EL color characteristics of the combined spectra of the individual FDs are produced. This dopant scheme has been described in considerable detail for EL devices in the commonly-assigned U.S. Pat. No. 4,769,292. An important criterion for choosing a FD as a dopant capable of modifying the hue of light emission when present in a host material is a comparison of their energy band gap.

For efficient energy transfer from the host to the fluorescent dopant molecules, a necessary condition is that the energy band gap of the dopant is smaller than that of the host polymer. For efficient energy transfer from the host to phosphorescent dopants, the criterion is that the triplet energy of the host is larger than that of the dopants. Preferred FDs used as the dopant include but are not limited to coumarins, stilbenes, distrylstibenes, anthracene derivatives, tetracene, perlenes, rhodamines, and arylamines. Preferred phosphorescent dopants include but are not limited to organometallic iridium, platinum, palladium, or osmium compounds.

The molecular structures of the preferred FDs used in EL device are listed as follows:

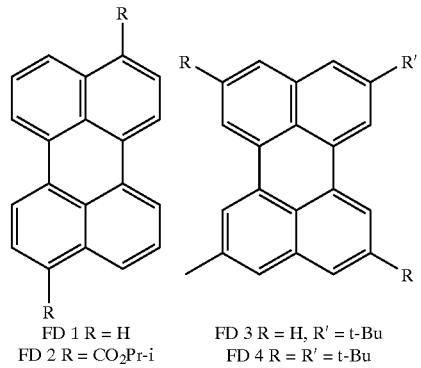

FD 1 R = H
FD 2 R = CO$_2$Pr-i

FD 3 R = H, R' = t-Bu
FD 4 R = R' = t-Bu

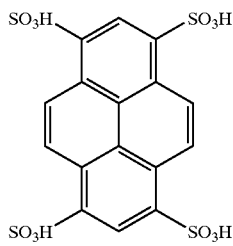

FD 5

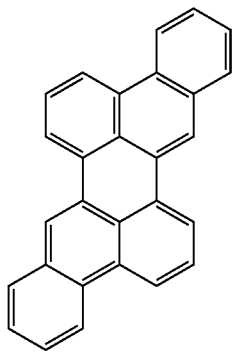

FD 6

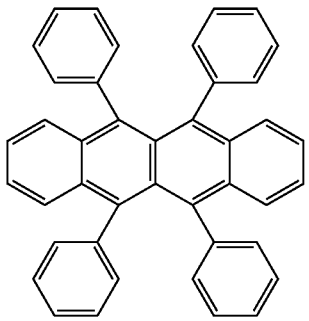

FD7

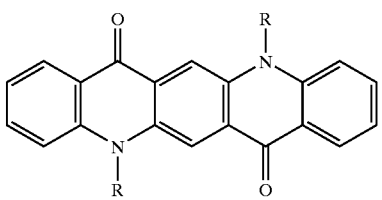

FD 8 R =H
FD 9 R = Me
FD 10 R = Pr-i
FD 11 R = 2-ethylhexyl

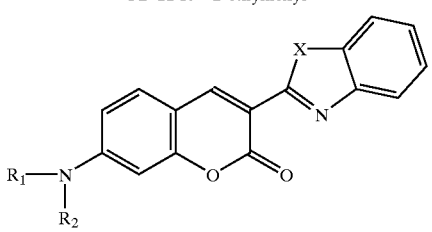

FD 12 R$_1$ = R$_2$ = Me, X = O
FD 13 R$_1$ = R$_2$ = hexyl, X = O
FD 14 R$_1$ = R$_2$ = phenyl, X = O
FD 15 R$_1$ = R$_2$ = Me, X = S
FD 16 R$_1$ = R$_2$ = hexyl, X = S
FD 17 R$_1$ = R$_2$ = phenyl, X = S -continued

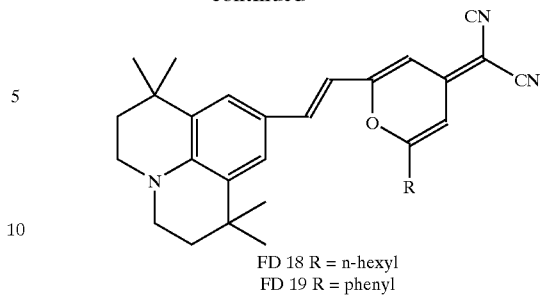

FD 18 R = n-hexyl
FD 19 R = phenyl

The polymers according to the present invention can also be used as dopants for other EL materials, or may be finely distributed in a non-EL polymer, such as in the matrix of a thermoplastic polymer. Such distribution can improve the processing and physical properties of the polymers.

The polymerization method and the molecular weights of the resulting polymers used in the present invention are illustrative only. The polymers may be prepared by condensation polymerizations, preferably by cross-coupling reactions such as the Pd-catalyzed Suzuki coupling reaction. Such a reaction was first reported by Suzuki et al on the coupling of aromatic boronic acid derivatives with aromatic halides (Suzuki, A. et al *Synthetic Comm.* 1981, 11(7), 513). A modified process was reported by Inbasekaran et al to prepare conjugated polymers for EL devices (Inbasekaran, M. et al U.S. Pat. No. 5,777,070). According to the present invention, the above-mentioned polymers were prepared by Suzuki coupling reaction of an aromatic diboronic acid ester with an aromatic dibromide. The general process for the preparation of ladder polymers is disclosed by Scherf et al. (*Makromol. Chem., Rapid Commun.* 1991, 12, 489). The synthetic schemes for polymers and monomers are illustrated in Schemes 1–3.

FIG. 1 illustrates the basic structure used to construct organic EL devices. It is a bi-layer structure including a hole transport layer 30 and an electron transport layer 40. The electron transport layer 40 is also the emissive layer from which electroluminescence originates. Together they form the EL medium 50. The anode layer 20 is adjacent to the hole transport layer 30 and the cathode 60 is adjacent to the electron transport layer 40. The substrate is layer 10. This figure is for illustration only and the individual layer thickness is not scaled according to the actual thickness.

Figure 2:
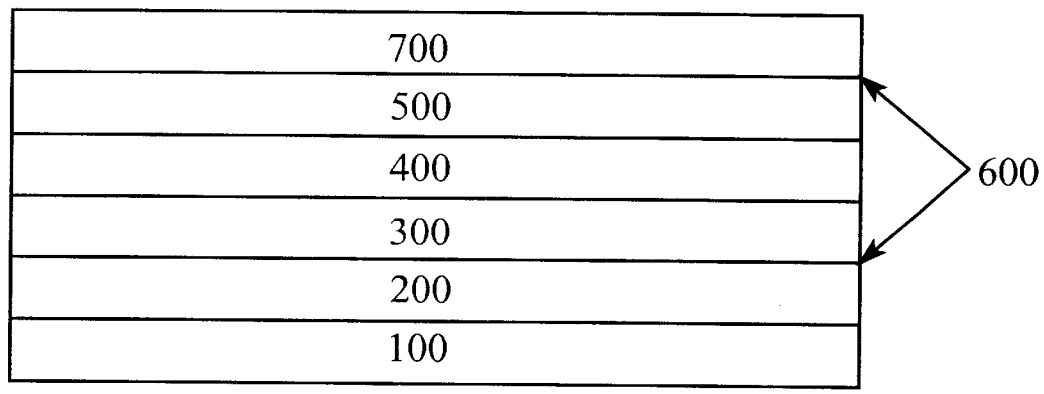
FIG. 2 illustrates a cross-section of a modified bi-layer EL device which can use a polymer in accordance with the present invention.

FIG. 2 illustrates an alternative construction of the EL device. It is a modified bi-layer structure. The EL medium contains an emissive layer between the hole transport layer and the electron transport layer. This emissive layer is the layer where electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

The bi-layer EL devices are the basic structure providing high luminous efficiency and low operating voltage. Alternative EL device structures have been demonstrated to provide improved device performance. These alternative structures include features in addition to the basic bi-layer structure such as the following structure A) hole injection layer as disclosed in the commonly-assigned U.S. Pat. No. 4,356,429; B) cathode modification with alkaline or alkaline halides as disclosed in the commonly-assigned U.S. Pat. No.

5,776,622; C) anode modification with plasma-deposited fluorocarbons as disclosed in commonly-assigned U.S. patent application Ser. No. 09/191,705; and D) doped emitter layer inserted between the hole transport and electron transport layer as disclosed in the commonly-assigned U.S. Pat. No. 4,769,292.

Figure 3:
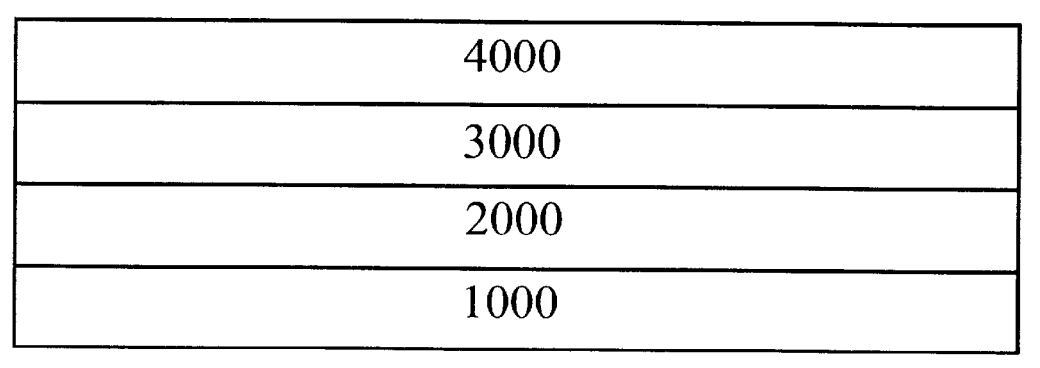

FIG. 3 illustrates another alternative construction of an EL device. It is a single-layer structure comprising an emitting layer 3000, sandwiched between an anode 2000 and a cathode 4000. The emitting layer 3000 also acts as a charge carrier layer. Thus, single layer 3000 is the electroluminescent medium. The substrate is layer 1000. This figure is for illustration only and the individual layer thickness is not scaled according to the actual thickness.

A preferred EL device structure of this invention is a single-layer structure including an anode, a cathode, and single layer of electroluminescent medium. This electroluminescent layer is the emissive layer, and is also capable of transporting electrons as well as holes. The principal function of this layer is to provide efficient emissive centers for electroluminescence. This layer can include one of the above mentioned polymers or the blend of two or more polymers; polymers doped with one or more FD, phosphorescent materials, or other light-emitting materials; other EL materials doped with one or more of the above mentioned polymers; or one or more of the above mentioned polymers finely distributed in a non-EL polymer.

The above-mentioned polymers can be deposited as high quality transparent thin films by spin-coating or inkjet printing the polymer solutions. Preferably, the spin-coating technique is used to form layer 3000, and preferably, only one polymer is deposited as single layer of electroluminescent medium.

Preferred materials for use in forming the anode modified with fluorocarbons are disclosed in commonly-assigned U.S. patent application Ser. No. 09/191,705. The anode can also be modified by a conducting polymer such as poly(3, 4-ethylene dioxythiphene) (PEDOT) (Groenendaal, L. et al. *Adv. Mater.* 2000, 12, 481). Preferred materials for use in forming the cathode of the EL devices of this invention are Mg, Li, or alloys of these materials as disclosed in U.S. Pat. No. 5,429,884 (Namiki, et al.) and the commonly-assigned U.S. Pat. No. 5,776,622.

EXAMPLES

The invention and its advantages are further illustrated by the following specific examples:

Monomers to be used in the present invention are illustrative only. Any monomers can be used as long as the polymer formed satisfies the general formula I:

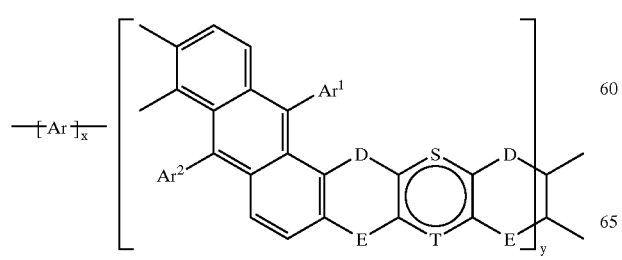

I

Typical monomer and polymer synthesis is illustrated in Schemes 1–3.

Synthesis of Monomers

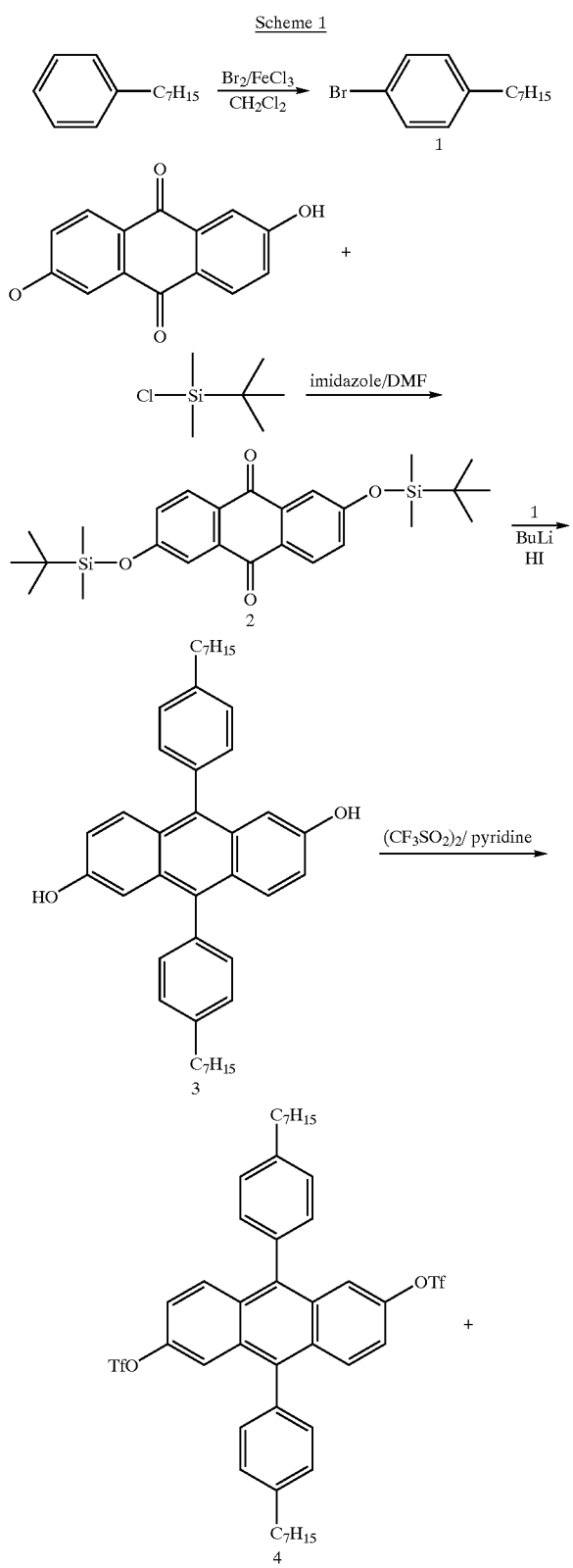

-continued
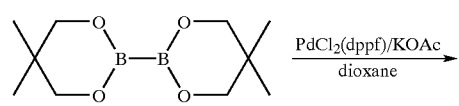
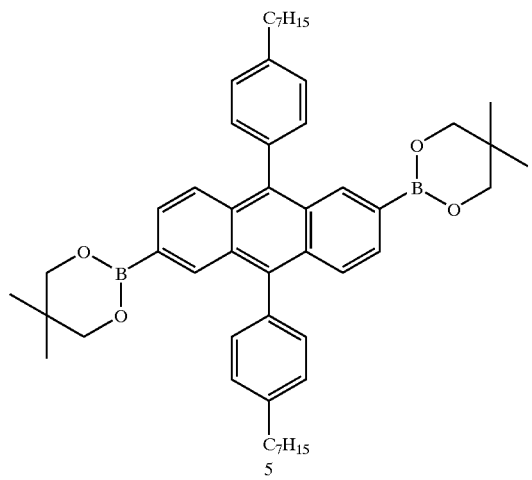
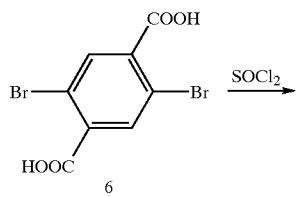
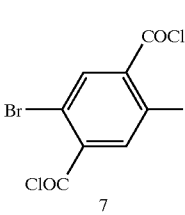 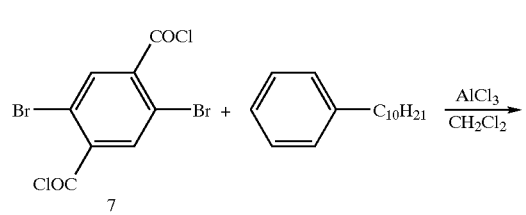
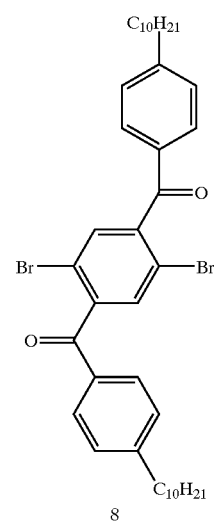
Scheme 2
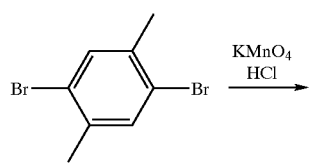
Synthesis of Polymers
Scheme 3
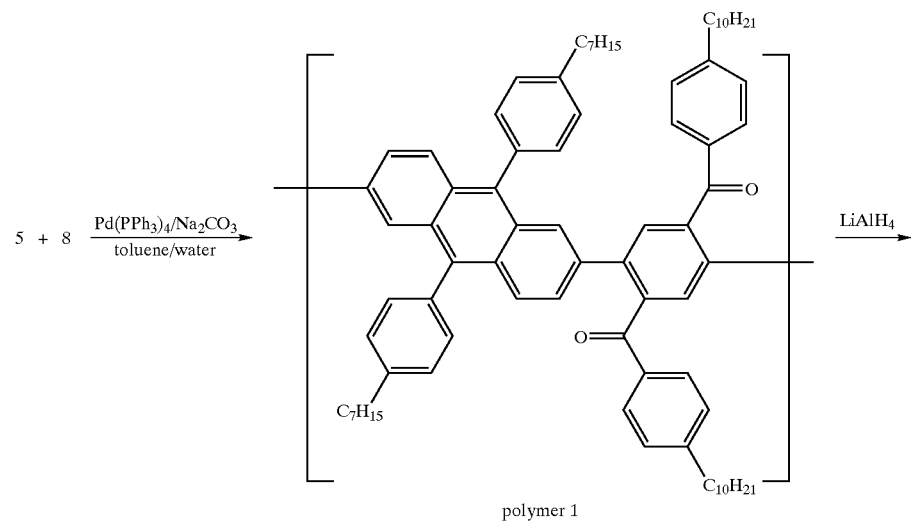

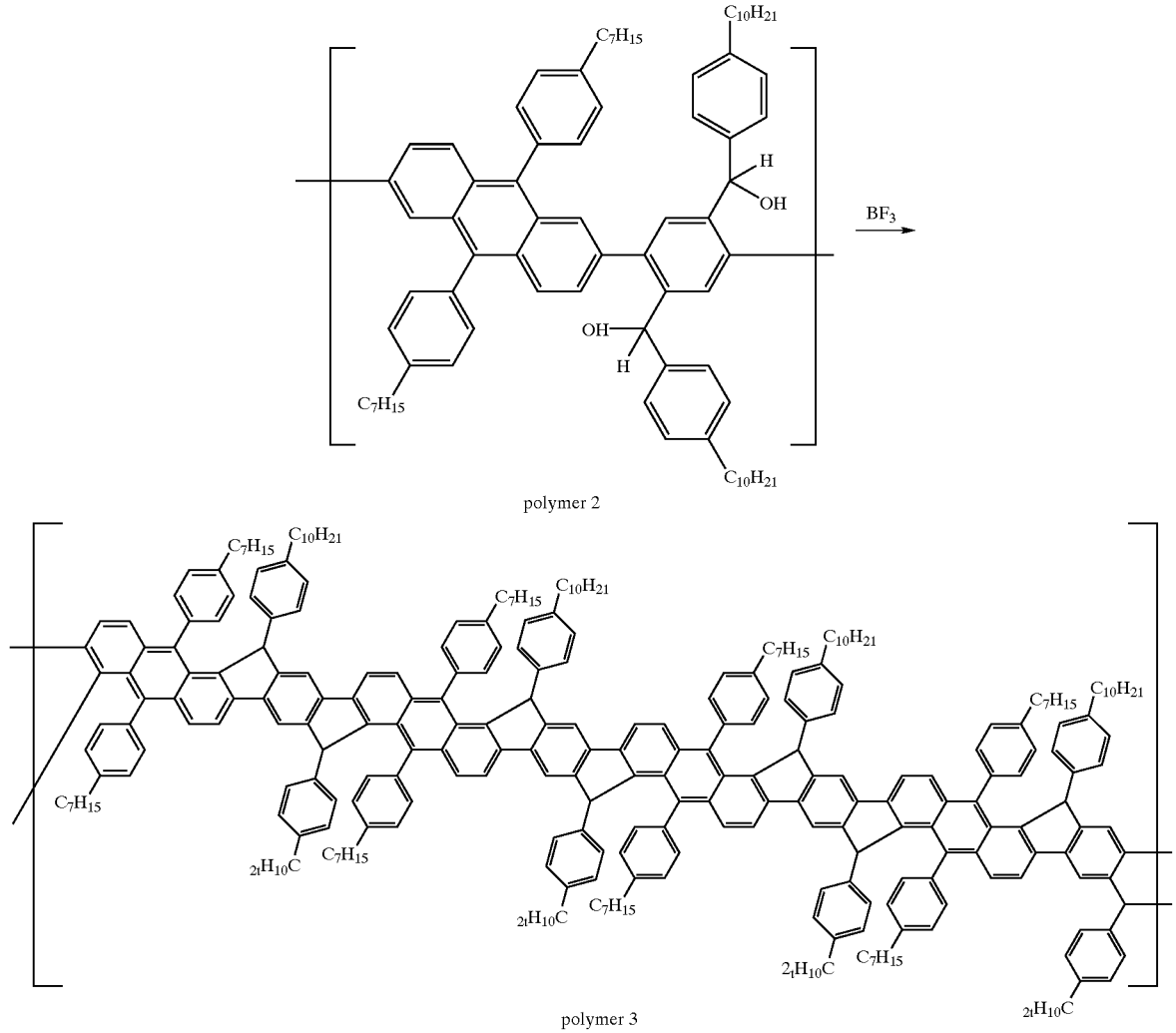

polymer 2 polymer 3

Example 1

Synthesis of 1-Bromo-4-heptylbenzene (Compound 1)

Phenylheptane (100 g, 0.57 mol) was dissolved in 900 mL of chloroform, and ferric chloride (1.41 g, 9 mmol) was added. The mixture was cooled to 0° C. and bromine (32 mL, 0.62 mmol) was added dropwise through an additional funnel. The reaction was kept in dark to prevent the bromination of the aliphatic side chain. After stirring at room temperature overnight, the reaction was quenched with 1N KOH. After extraction, the organic phase was washed with water and dried over $MgSO_4$. The crude product was a brown oil and was purified by column chromatography on silica gel using heptane as an eluent to give 60 g of pure product as light yellow oil at 42% yield. $^1H$ NMR ($CDCl_3$) δ (ppm): 0.88 (t, J=6.9 Hz, 3H), 1.26–1.31 (m, 8H), 1.54–1.59 (m, 2H), 2.54 (t, J=7.8 Hz, 2H), 7.04 (d, J=8.2 Hz, 2H), 7.38 (d, J=8.2 Hz, 2H). FD-MS: m/z 255 ($M^+$).

Example 2

Synthesis of 2,6-bis(t-Butyldimethylsilyloxy) anthraquinone (Compound 2)

To a 2-L round-bottomed flask were added 2,6-dihydroxyanthraquinone (80.0 g, 0.33 mol), imidazole (108.8 g, 1.6 mol), t-butyldimethylsilyl chloride (115.5 g, 0.77 mol), and DMF 600 mL. The dark red mixture was heated to 90° C. for 3 h. TLC indicated the completion of the reaction. The reaction was cooled down and poured into 2 L of cool water. The dark green needle like precipitate was filtered off and washed with water and methanol. The dark green crystals were dissolved in ether and the black insoluble part was filtered off. The bright yellow filtrate was concentrated and the crude product was suspended in boiling methanol. The yellow precipitate was filtered to give 85.1 g of pure product as yellow silky crystals at 54% yield. $^1H$ NMR ($CDCl_3$) δ (ppm): 0.28 (s, 12H), 1.00 (s, 18H), 7.14 (dd, $J_1$=8.5 Hz, $J_2$=2.5 Hz, 2H), 7.64 (d, J=2.5 Hz, 2H), 8.17 (d, J=8.5 Hz, 2H). $^{13}C$ NMR ($CDCl_3$): 4.36, 25.53, 117.35, 125.34, 127.57, 129.73, 135.73, 161.26, 182.17. Mp 131–133° C. FD-MS: m/z 468 ($M^+$).

Example 3

Synthesis of 9,10-bis(4-Heptyl)phenyl-2,6-dihydroxyanthracene (Compound 3)

Compound 2 (37 g, 0.079 mol) was dissolved in 200 mL of anhydrous THF and cooled to −78° C. To this solution was added n-BuLi (2.5 M in hexane, 94 mL, 0.24 mol) slowly to maintain the temperature below −60° C. After addition, the orange-yellow solution was stirred at −78° C. for an hour. Compound 1 (60.2 g, 0.24 mol) was dissolved in 100 mL of anhydrous THF and added dropwise to the above cooled solution. The reaction was slowly warmed up to room temperature and stirred at room temperature overnight. The reaction was quenched with HI aqueous solution (47% in water, 143 mL, 0.79 mol) and TBDMS group was also de-protected. The deep brown reaction was heated to reflux for 10 min. and most of the solvent was removed under reduced pressure. The reaction mixture was then extracted with methylene chloride three times. The combined organic phase was washed with saturated sodium metabisulfate solution, water, and brine, and dried over $MgSO_4$. The crude product was obtained as brown viscous oil and was purified by column chromatography on silica gel with 10/90 ether/hexane as an eluent. The pure product was obtained as 22.4 g light yellow brown solid at 51% yield. $^1H$ NMR ($CDCl_3$) δ (ppm): 0.91 (t, J=7.0 Hz, 6H), 1.26–1.43 (m, 8H), 1.71–1.81 (m, 2H), 2.73 (t, J=7.8 Hz, 2H), 5.21 (s, br, 2H, OH), 6.89 (d, J=2.3 Hz, 2H), 6.96 (dd, $J_1$=9.5 Hz, $J_2$=2.5 Hz, 2H), 7.32 (d, J=8.6 Hz, 4H, phenyl), 7.35 (d, J=8.6 Hz, 4H, phenyl), 7.57 (d, J=9.4 Hz, 2H). $^{13}C$ NMR ($CDCl_3$): 14.16, 22.72, 29.26, 29.52, 31.60, 31.86, 35.90, 106.84, 118.58, 127.07, 128.46, 128.98, 129.64, 131.04, 134.94, 136.30, 142.10, 151.69. Mp 162–164° C. FD-MS: m/z 558 ($M^+$).

Example 4

Synthesis of 9,10-bis(4-Heptyl)phenyl-2,6-di (triflate)anthracene (Compound 4)

Compound 3 (17.8 g, 0.032 mol) was dissolved in 65 mL of dry pyridine and cooled to 0° C. To this brown red solution was added slowly triflate anhydride (16 mL, 0.096 mol). The dark red reaction was stirred at room temperature overnight. The reaction was poured into water and extracted with ether (3×200 mL). The combined organic phase was washed with 2N HCl (2×200 mL) and dried over $MgSO_4$. The crude product was purified by column chromatography on silica gel using hexane as an eluent to give 13.1 g of blue fluorescent light yellow product at 50% yield. $^1H$ NMR ($CDCl_3$) δ (ppm): 0.92 (t, J=7.0 Hz, 6H), 1.26–1.43 (m, 8H), 1.76–1.81 (m, 2H), 2.81 (t, J=7.9 Hz, 2H), 7.25 (dd, $J_1$=9.6 Hz, $J_2$=2.3 Hz, 2H), 7.34 (d, J=7.9 Hz, 4H, phenyl), 7.44 (d, J=7.9 Hz, 4H, phenyl), 7.61 (d, J=2.2 Hz, 2H), 7.86 (d, J=9.6 Hz, 2H). FD-MS: m/z 822 ($M^+$).

Example 5

Synthesis of 2,6-bis(2,2-Dimethyltrimethylene diboronate)-9,10-bis(4-heptyl)phenyl)anthracene (Compound 5)

Compound 4 (2.7 g, 0.003 mol), bis(neopentyl glycolato) diboron (1.6 g, 0.007 mol), 1,1'-bis(diphenylphosphino) ferrocene)dichloropalladium (II)/dichloromethane complex (0.16 g, 6 mol % to compound 4), 1,1'-bis (diphenylphosphino)ferrocene (0.11 g, 6 mol % to 4), and potassium acetate (1.9 g, 0.02 mol) were mixed with 50 mL of dioxane. The mixture was degassed with nitrogen for 10 min. and then heated to 80° C. overnight. The reaction was cooled and ice water 50 mL was added. Brown precipitate formed and was filtered, washed with water and hexane to give 1.3 g of product as light green solid at 53% yield. $^1H$ NMR ($CDCl_3$) δ (ppm): 0.91 (t, J=7.0 Hz, 6H), 0.98 (s, 12H), 1.34–1.45 (m, 8H), 1.80–1.82 (m, 2H), 2.80 (t, J=7.9 Hz, 2H), 3.70 (s, 8H), 7.39–7.40 (m, 4H), 7.64–7.65 (m, 8H), 8.24 (s, 2H). $^{13}C$ NMR ($CDCl_3$): 14.16, 21.93, 22.73, 29.30, 29.38, 31.39, 31.79, 31.92, 35.89, 72.21, 125.97, 128.24, 128.27, 129.98, 130.97, 131.29, 134.42, 136.17, 137.75, 141.67. M.p. 172–174° C.; FD-MS: m/z 750 ($M^+$).

Example 6

Synthesis of 2,5-Dibromoterephthalic Acid (Compound 6)

2,5-Dibromo-p-xylene (35 g, 0.13 mol) and potassium permanganate (210 g, 1.32 mol) were mixed in 1.2 L of water. The reaction was heated to reflux for 2 days until the purple color of pemanganate disappeared. The reaction was cooled and filtered through a pad of Celite. The filtrate was cooled in an ice-bath and neutralized by concentrated HCl solution until pH~1. The white crystalline product was filtered, washed with water, and dried over $P_2O_5$. $^1H$ NMR (DMSO) δ (ppm): 5.06 (s, br, 2H), 8.02 (s, 2H); FD-MS: m/z 324 ($M^+$).

Example 7

Synthesis of 2,5-Dibromoterephthaloyl Chloride (Compound 7)

Compound 6 (19.2 g, 0.059 mol) was suspended in 30 mL of thionyl chloride and heated to reflux. Large amount of gas evolved in first 20 min. and the reaction became clear. The reaction was refluxed for 4 h and the excess of thionyl chloride was distilled off. To the light yellow residue was added dry hexane and the mixture was heated to reflux until all solid dissolved. The solution was cooled down and white crystals formed. The crystals were filtered off, washed with dry hexane, and dried under vacuum at room temperature overnight to give 19.2 g product at 90% yield. $^1H$ NMR ($CDCl_3$) δ (ppm): 8.20 (s, 2H). Mp 80–82° C.

Example 8

Synthesis of 1,4-Dibromo-2,5-bis((4-decylphenyl) carbonyl)benzene (Compound 8)

Compound 7 (19.2 g, 0.059 mol) was dissolved in 100 mL of dry $CH_2Cl_2$, and aluminum chloride (16.6 g, 0.12 mol) was added. The reaction turned orange and some precipitate formed. The reaction was cooled to 0° C., and phenyldecane (45.3 g, 0.21 mol) in 50 mL of dry $CH_2Cl_2$ was added through an additional funnel. The reaction was stirred at room temperature under nitrogen overnight. The reaction was quenched carefully with 1 N HCl, extracted with $CH_2Cl_2$, and the combined organic phase was dried over $MgSO_4$. The crude product was obtained as off-white solid and was recrystallized from acetone to give 31.8 g of pure product as white crystals at 74% yield. $^1H$ NMR ($CDCl_3$) δ (ppm): 0.88 (t, J=6.7 Hz, 6H), 1.26–1.32 (m, 28H), 1.62–1.67 (m, 4H), 2.69 (t, J=7.6 Hz, 4H), 7.32 (d, J=7.9 Hz, 4H), 7.58 (s, 2H), 7.76 (d, J=7.9 Hz, 4H). Mp 128–129° C.

Example 9

Synthesis of Precursor Polymer 1

Compound 5 (1.18 g, 1.57 mmol) and compound 8 (1.14 g, 1.57 mmol) were dissolved in 7 mL of toluene. To this solution was added Aliquat® 336 (0.11 g, 0.27 mmol) and 2 N $Na_2CO_3$ solution (2.6 mL, 5.2 mmol). The mixture was bubbled with nitrogen for 10 min. and catalyst tetrakis (triphenylphosphine)palladium (54 mg, 3 mol %) was added. The reaction was heated to 100° C. for 24 h. Small amount of phenyl boronic acid was added to end-cap the bromo group and the reaction was heated for 6 h. The reaction was then end-capped with small amount of bromobenzene and heated for another 6 h. The polymer was precipitated from methanol, washed with 1 N HCl, and dried to give 1.58 g of light brown solid at 92% yield. The polymer was extracted with acetone in a Soxhlet set-up to remove oligomers and residual catalyst and then extracted with THF. The polymer was re-precipitated into methanol twice and dried under vacuum at 60° C. to give 1.31 g of brownish yellow solid at 77% yield. The polymer has a weight average molecular weight of 6810, and a polydispersity of 1.88 (in THF relative to polystyrene standards). Polymer shows a thermal onset decomposition temperature of 436° C., and a glass transition temperature of 47° C.

Example 10

Reduction of Polymer 1 to Give Polymer 2

Polymer 1 (0.5 g, 0.46 mmol repeat unit) was dissolved in 10 mL of dry THF and was added dropwise to a suspension of LAH (0.14 g, 3.6 mmol) in 15 mL of THF at 0° C. After 1 h, the reaction was quenched carefully with 1 N HCl and extracted with $CH_2Cl_2$. The combined organic phase was washed with $NaHCO_3$, dried over $MgSO_4$, concentrated, and precipitated into methanol. The precipitate was filtered and dried to give 0.3 g of brownish yellow solid with blue fluorescence at 60% yield.

Example 11

Cyclization of Polymer 2 to Give Polymer 3

Polymer 2 (0.2 g, 0.18 mmol repeat unit) was dissolved in 10 mL of dry $CH_2Cl_2$. To this solution was added $BF_3$ etherate (1.5 mL, 12.2 mmol) at 0° C. The solution turned dark green immediately. After 20 min., the reaction was quenched with water, extracted with $NaHCO_3$, and the organic phase was dried over $MgSO_4$. The solution was concentrated and precipitated into methanol to give greenish-yellow solid 0.15 g after drying under vacuum at 45° C. overnight (75% yield). The polymer shows strong green fluorescence. The polymer has a weight average molecular weight of 18800, and a polydispersity of 2.38 (in THF relative to polystyrene standards). Polymer shows a thermal onset decomposition temperature of 432° C., and no glass transition temperature was observed before the decomposition temperature.

EL Device Fabrication and Performance

Example 12

An EL device satisfying the requirements of the invention was constructed in the following manner. The organic EL medium has single layer of polymer thin film.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P from Bayer Corp.) was spin-coated onto ITO under a controlled spinning speed to obtain thickness of 500 Angstroms. The coating was baked in an oven at 120° C. for 20 min.

c) A toluene solution of a polymer (30 mg in 30 mL of solvent) was filtered through a 0.2 μm Teflon filter. The polymer solution was then spin-coated onto PEDOT under a controlled spinning speed. The thickness of the polymer film was between 500–700 Angstroms.

d) On the top of the polymer film was deposited a cathode layer of 2000 Angstroms thick consisting of a 10:1 atomic ratio of Mg and Ag.

The above sequence completed the deposition of the EL device. The device was then hermetically packaged in a dry glove box for protection against ambient environment.

Figure 4:
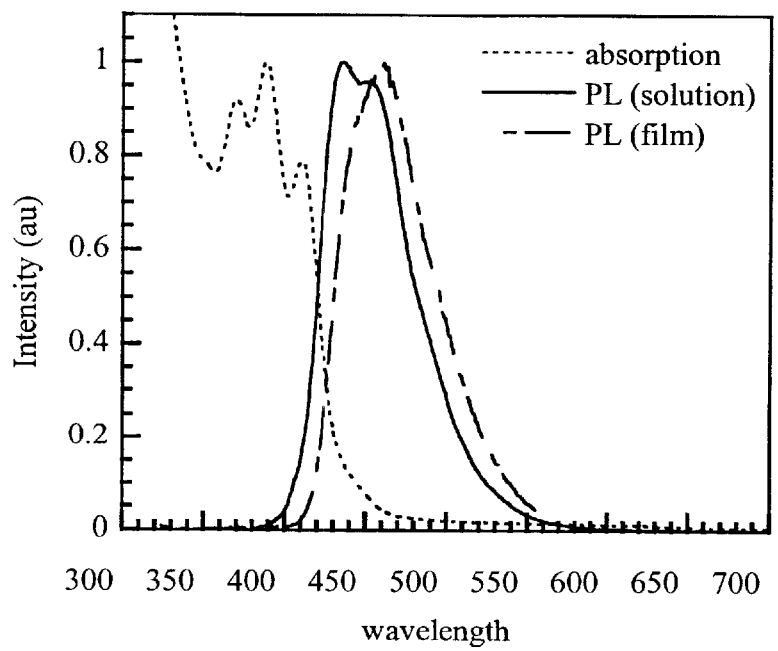
FIG. 4 illustrates the absorption, emission, and photoluminescence spectra of Polymer 2.
Figure 5:
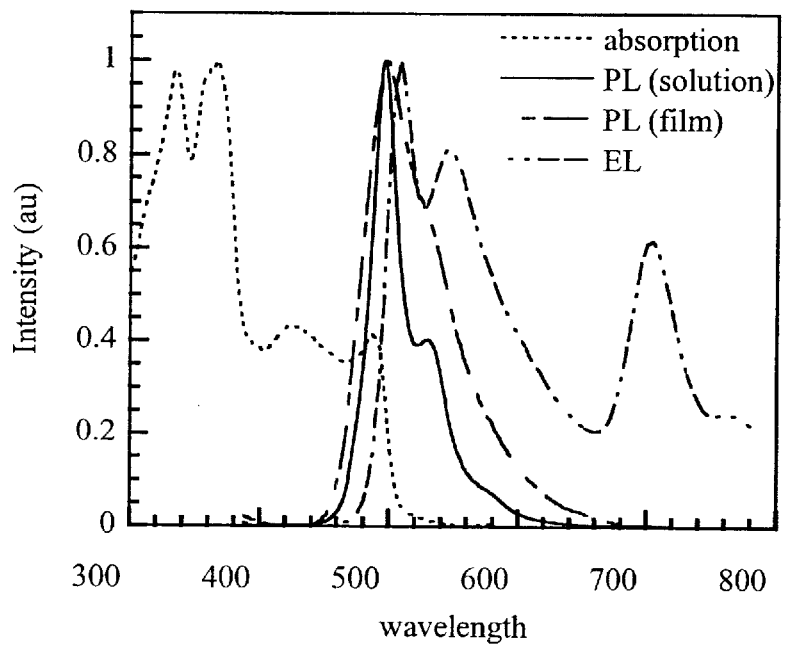
FIG. 5 illustrates the absorption, emission, photoluminescence, and EL spectra of Polymer 3.
Figure 6:
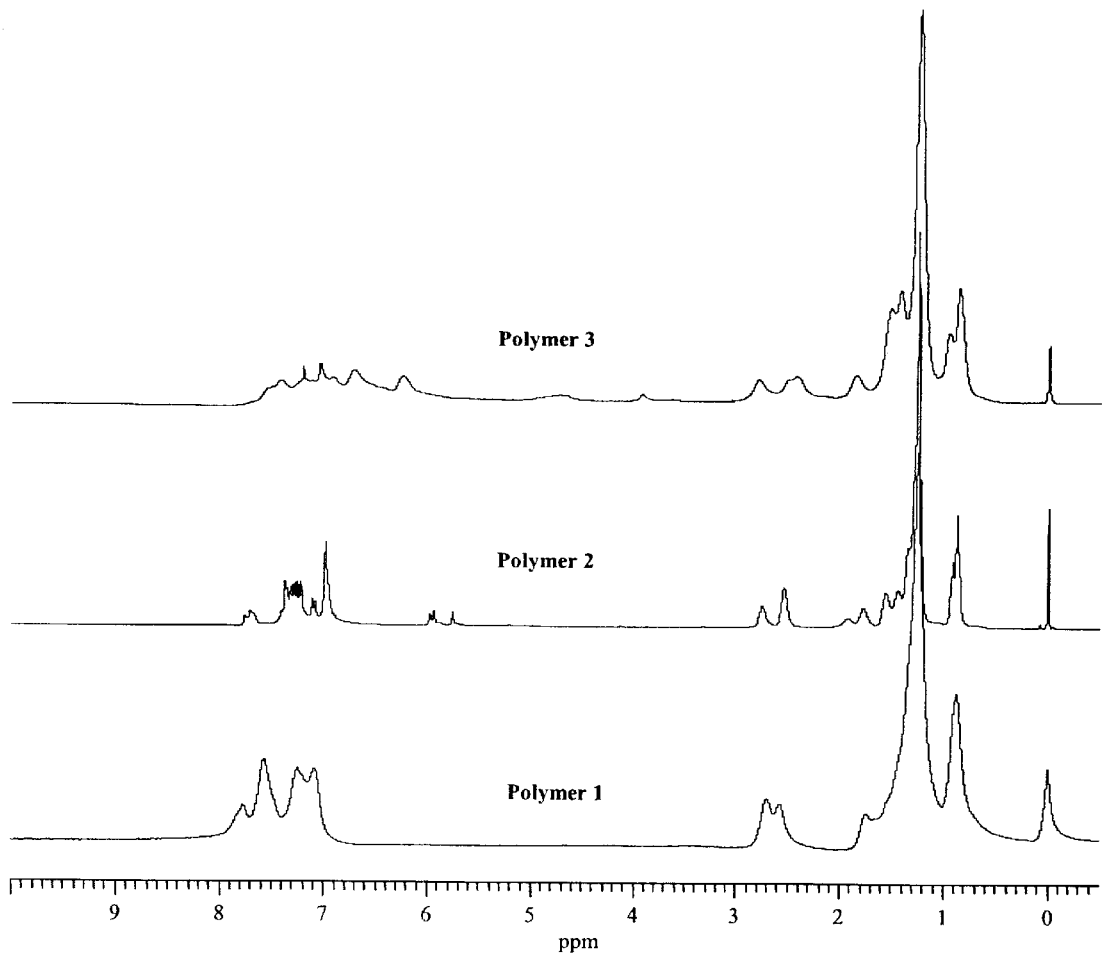
FIG. 6 illustrates the $^1H$ NMR spectra of Polymer 1, Polymer 2, and Polymer 3.
Figure 7:
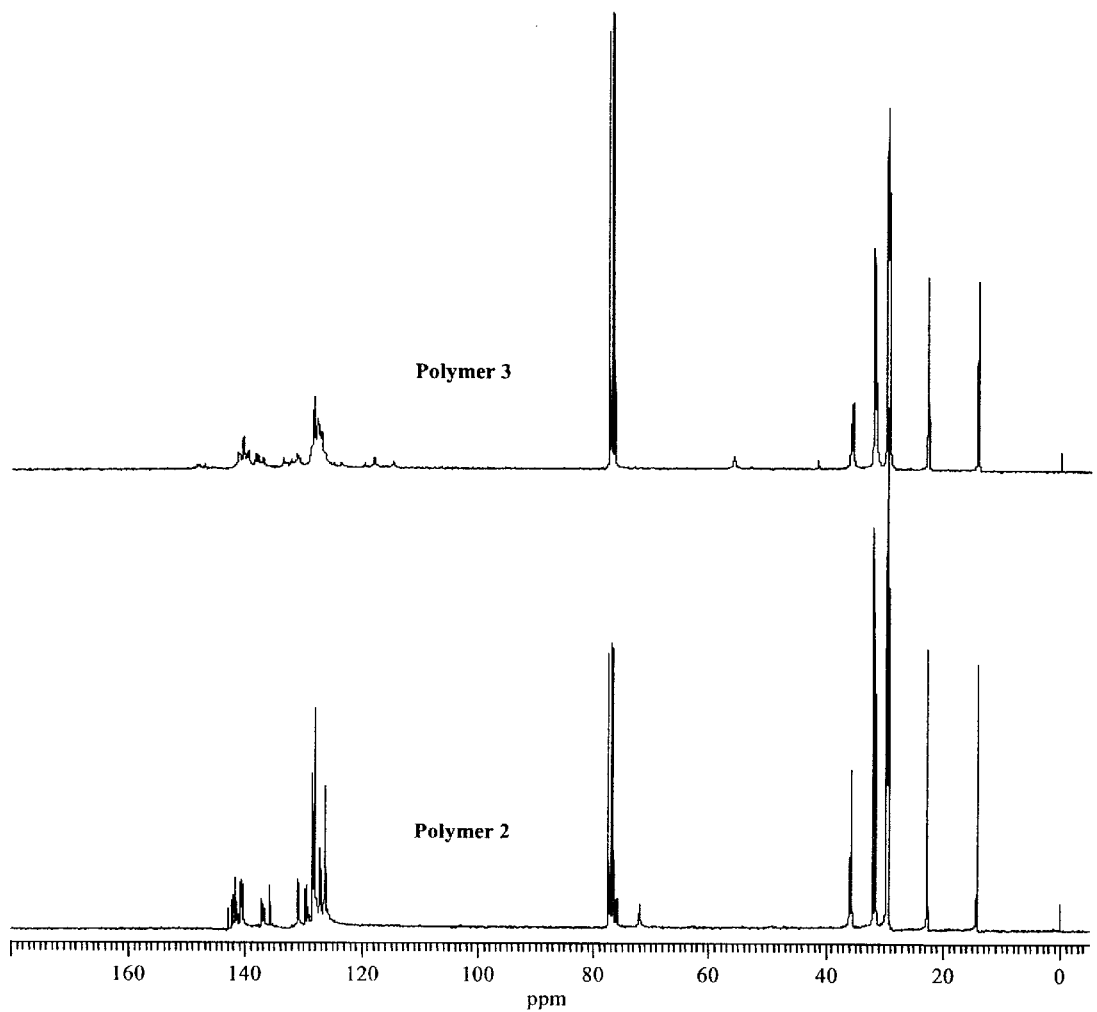
FIG. 7 illustrates the $^{13}$C NMR spectra of Polymer 2, and Polymer 3.

FIG. 4 shows the absorption, emission, and PL spectra of Polymer 2. FIG. 5 shows the absorption, emission, PL, and EL spectra of Polymer 3. Absorption and emission spectra were obtained from dilute toluene solutions, photoluminescence (PL) spectra from solid thin films of the polymers, and EL spectrum was obtained from ITO(PEDOT)/polymer/Mg:Ag EL devices.

The invention has been described in detail with particular reference to certain preferred embodiments thereof, but it will be understood that variations and modifications can be effected within the spirit and scope of the invention.

PARTS LIST 10 substrate
20 anode
30 hole transport layer
40 electron transport layer
50 EL medium
60 cathode
100 substrate
200 anode
300 hole transport layer
400 emissive layer
500 electron transport layer
600 EL medium
700 cathode
1000 substrate
2000 anode
3000 emitting layer
4000 cathode

What is claimed is:

1. An organic light emitting diode having an anode, a cathode and an emissive layer disposed between the anode and cathode, the emissive layer including the following repeating unit which is used to form a homopolymer or a copolymer comprising the structure:

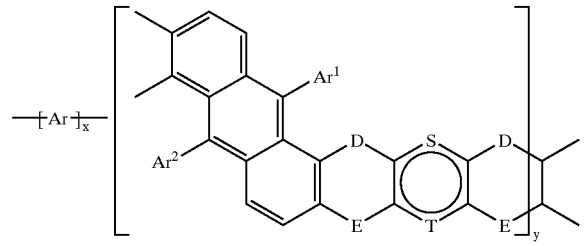

wherein:

$0 \leq x < 1$, $0 < y \leq 1$, and $x+y=1$;

S and T are each independently a chemical bond, an oxygen or sulfur atom, or C—R, or N—R wherein C is a carbon atom, N is a nitrogen atom, and R is a substituent including hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

In each ring, including D and E, if either D or E is a single bond, then the other group is not a single bond and is R—C—R, wherein C is a carbon atom and R is a substituent;

Ar$^1$, Ar$^2$, and Ar are each individually aryl or substituted aryl of from 6 to 40 carbon atoms; or Ar$^1$, Ar$^2$, and Ar are each individually substituted heteroaryl or unsubstituted heteroaryl having 4 to 40 carbons.

2. The organic light emitting diode of claim 1 wherein Ar includes more than one Ar group.

3. The organic light emitting diode of claim 1, wherein:

Ar$^1$ and Ar$^2$ individually represent

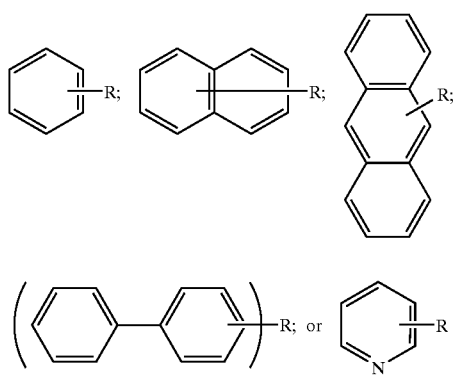

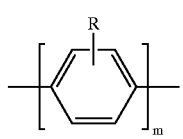

wherein R is hydrogen, alkyl group of from 1 to 24 carbon atoms, or aryl substituted aryl of from 6 to 28 carbon atoms, or heteroaryl or substituted heteroayl of from 4 to 40 carbons, or a cyano group, a nitro group, a chlorine, bromine, or a fluorine atom.

4. The organic light emitting diode of claim 1, wherein Ar represents:

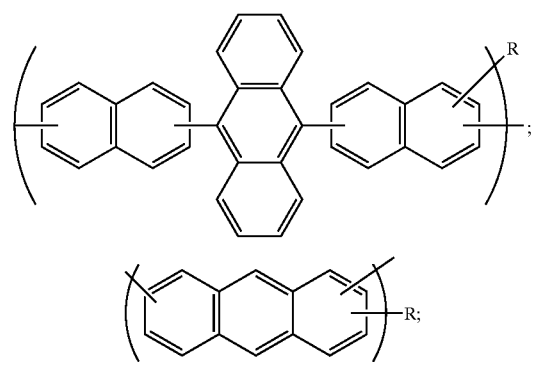

wherein m is an integer from 1 to 3;

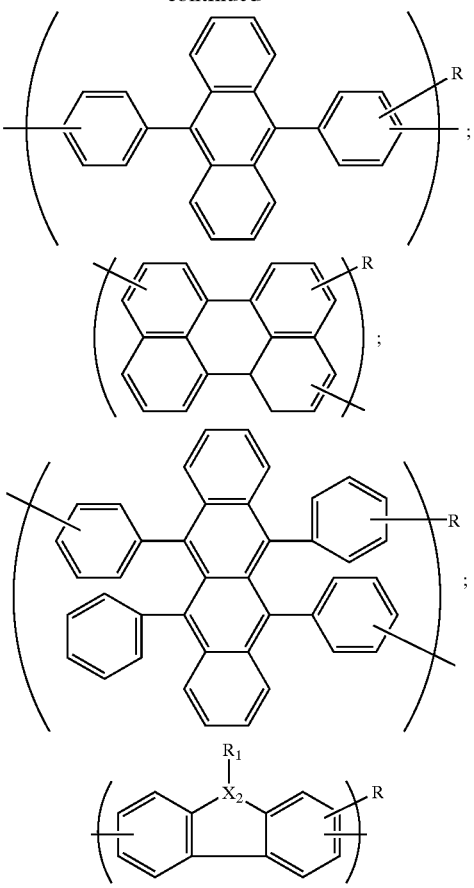

wherein

R$_1$ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons; and X$_2$ is a nitrogen or carbon atom;

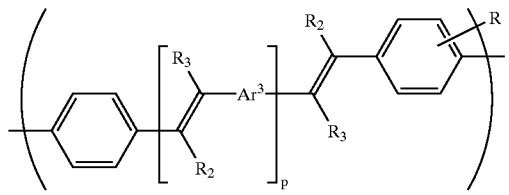

wherein:

Ar$^3$ is the same as Ar; and

R$_2$ and R$_3$ are independently hydrogen, alkyl group of from 1 to 24 carbon atoms, or aryl or substituted aryl of from 6 to 28 atoms, or heteroaryl or substituted heteroaryl of from 4 to 40 atoms, or a cyano group;

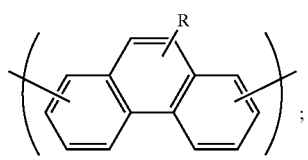

-continued
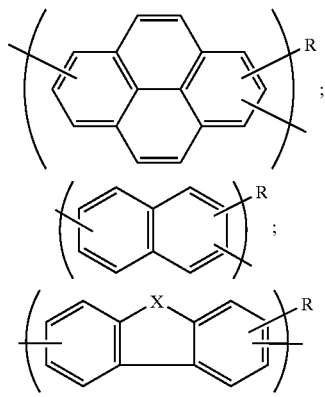
wherein:
X is an O or S atom,
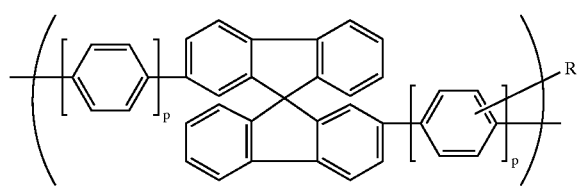
wherein: p is an integer from 0 to 2;
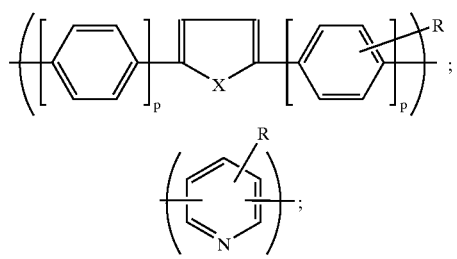
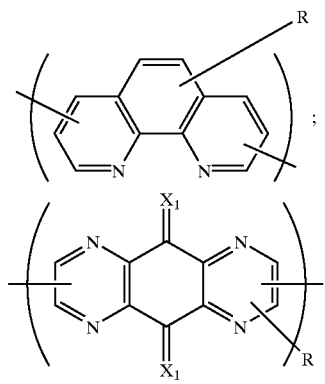
wherein:
$X_1$ is an O atom or two cyano groups;
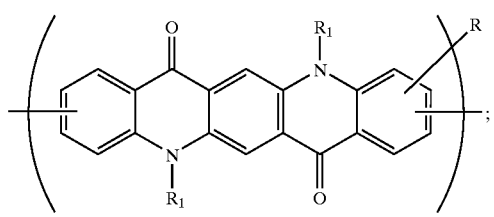
-continued
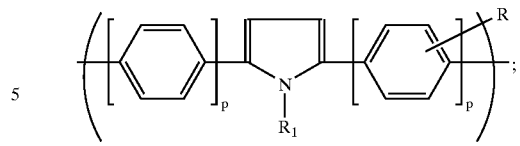
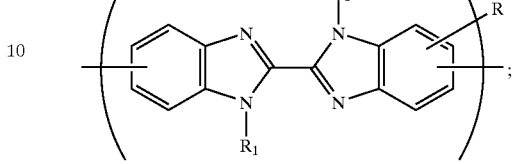
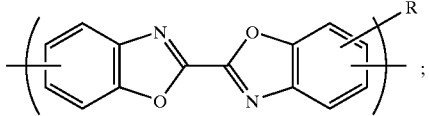
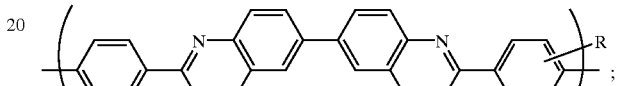
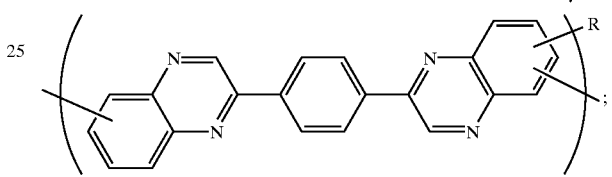
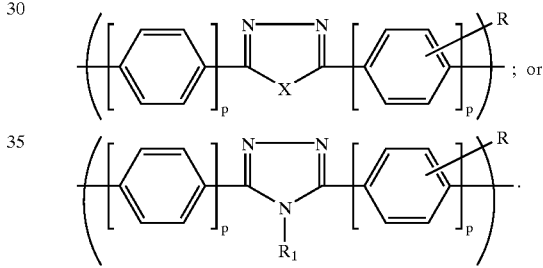
5. The organic light emitting diode of claim 3, wherein Ar represents:
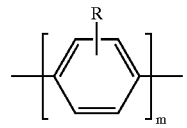
wherein m is an integer from 1 to 3;
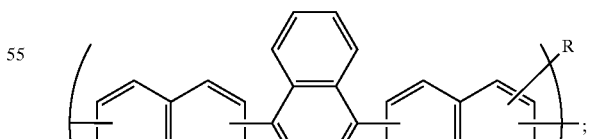
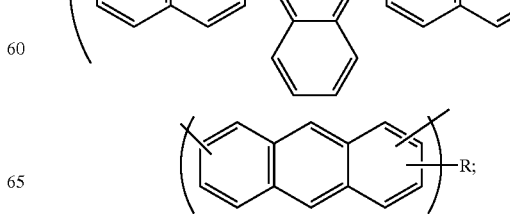

-continued

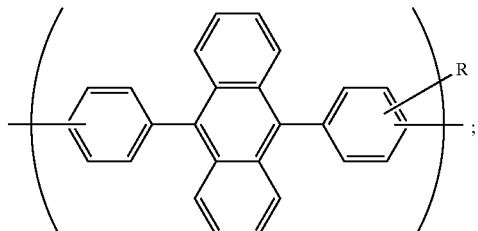

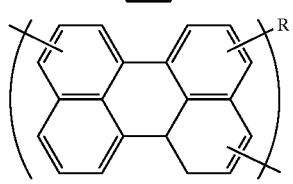

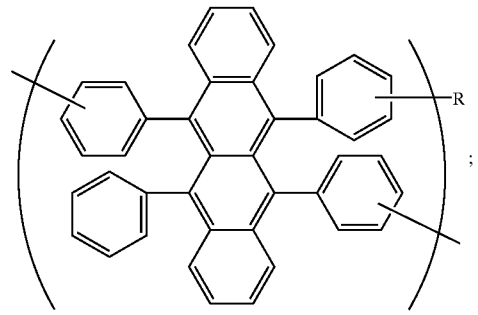

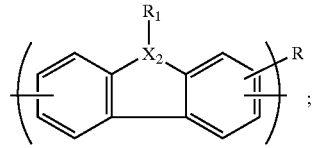

wherein:
  R₁ is a substituent including hydrogen, alkyl group of from 1 to 24 carbon atoms, or aryl or substituted aryl of from 6 to 28 carbon atoms, or heteroaryl or substituted heteroaryl of from 4 to 40 carbons; and
  X₂ is a nitrogen or carbon atom;

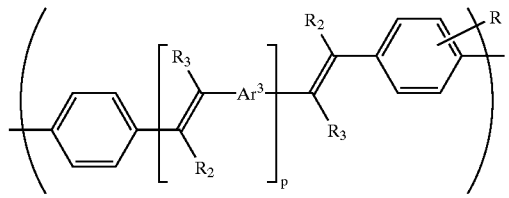

wherein:
  Ar³ is the same as Ar; and
  R₂ and R₃ are independently hydrogen, alkyl group of from 1 to 24 carbon atoms, or aryl or substituted aryl of from 6 to 28 atoms, or heteroaryl or substituted heteroayl of from 4 to 40 atoms, or a cyano group;

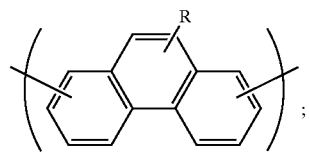

-continued

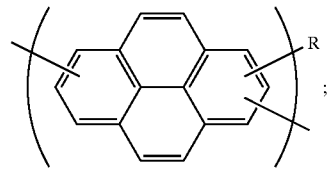

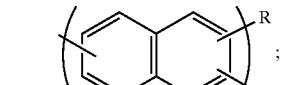

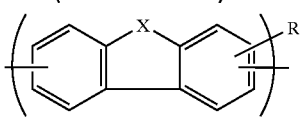

wherein X is an O or S atom;

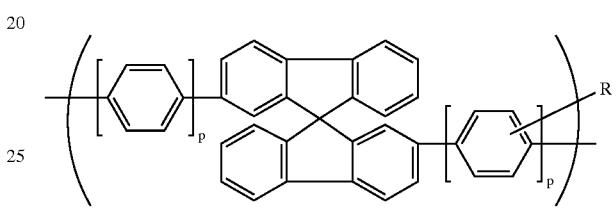

wherein p is an integer from 0 to 2;

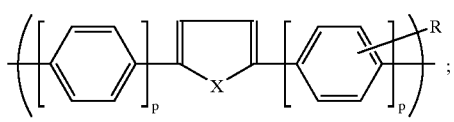

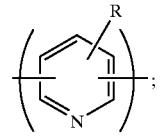

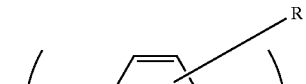

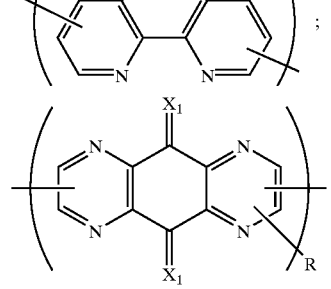

wherein X₁ is an O atom or two cyano groups;

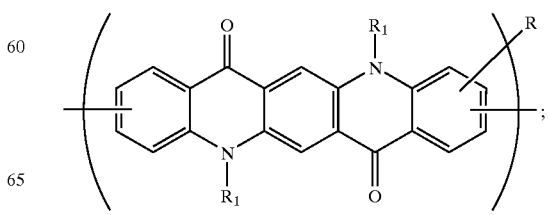

-continued

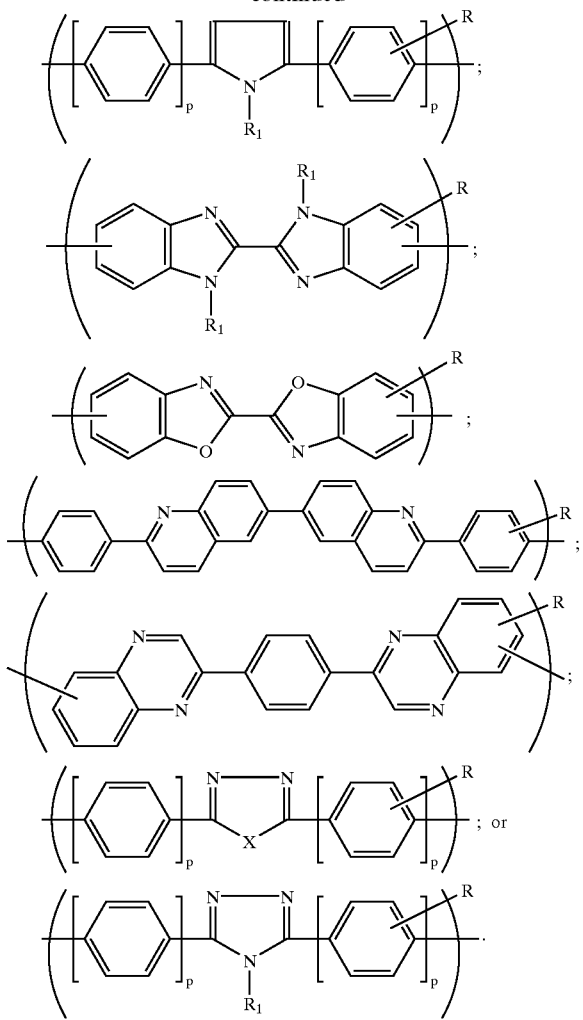

6. The organic light emitting diode of claim 1, wherein S and T are C—R.

7. The organic light emitting diode of claim 6, wherein R is hydrogen.

8. The organic light emitting diode of claim 1, comprising from 0.01 to 30 weight percent of dopes.

9. The organic light emitting diode of claim 1, comprising dopes selected from the group consisting of alkali metals, protonic acids, Lewis acids, halogens, and mixture of thereof.

10. The organic light emitting diode of claim 1, wherein the repeating unit is

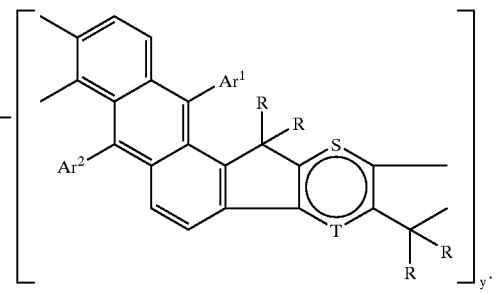

11. The organic light emitting diode of claim 1, wherein $Ar^1$, $Ar^2$, and Ar are each individually unsubstituted aryl of from 6 to 40 carbon atoms.

12. The organic light emitting diode of claim 10, wherein $Ar^1$, $Ar^2$, and Ar are each individually unsubstituted aryl of from 6 to 40 carbon atoms.

13. The organic light emitting diode of claim 12, wherein S and T are each a single bond.

* * * * *